United States Patent [19]

Kirkby

[11] Patent Number: 4,583,227
[45] Date of Patent: Apr. 15, 1986

[54] TEMPERATURE COMPENSATING SEMICONDUCTOR LASERS

[75] Inventor: Paul A. Kirkby, Harlow, United Kingdom

[73] Assignee: ITT Industries, Inc., New York, N.Y.

[21] Appl. No.: 577,651

[22] PCT Filed: Feb. 8, 1983

[86] PCT No.: PCT/GB83/00035
§ 371 Date: Oct. 11, 1983
§ 102(e) Date: Oct. 11, 1983

[87] PCT Pub. No.: WO83/02856
PCT Pub. Date: Aug. 18, 1983

[30] Foreign Application Priority Data

Feb. 9, 1982 [GB] United Kingdom ............... 8203649

[51] Int. Cl.⁴ ............................................. H01S 3/13
[52] U.S. Cl. ...................................... 372/32; 372/44; 372/92
[58] Field of Search ............... 372/44, 49, 92, 50, 372/29, 30, 31, 32, 36, 33

[56] References Cited

U.S. PATENT DOCUMENTS

| | | | |
|---|---|---|---|
| 4,143,940 | 3/1979 | Khoe | 350/96.15 |
| 4,156,206 | 5/1979 | Comerford et al. | 372/36 |
| 4,293,826 | 10/1981 | Scifres et al. | 372/44 |

FOREIGN PATENT DOCUMENTS

| | | | |
|---|---|---|---|
| 0021391 | 2/1981 | Japan | 372/49 |
| 0045091 | 4/1981 | Japan | 372/92 |
| 0150886 | 11/1981 | Japan | 372/92 |
| 0150887 | 11/1981 | Japan | 372/44 |

Primary Examiner—James W. Davie
Attorney, Agent, or Firm—John T. O'Halloran; Thomas P. O'Hare

[57] ABSTRACT

A semiconductor laser is constructed such that at least a part of the laser optical feedback is provided by an external reflector spaced from the semiconductive material of the laser so as to form a composite optical cavity bounded by the semiconductive material and the reflector. The external reflector is supported on a mount constructed such that in response to changes in temperature the mount moves the external reflector relative to the adjacent surface of the semiconductive material so as to provide the external part of the optical cavity with a thermal coefficient substantially matched with the mode wavelength expansion coefficient of the internal part of the cavity. In another embodiment the external reflector is supported on a mount constructed such that in response to changes in temperature it moves the external reflector relative to the adjacent surface of the semiconductor material so as to provide the external part of the optical cavity with a thermal expansion coefficient substantially matched with the peak gain wavelength expansion coefficient. In other embodiments, the external reflector is supported on a mount constructed such that in response to temperature changes it moves the reflector relative to the anti-reflection coated adjacent surface of the semiconductor material so as to provide the external part of the cavity with a thermal expansion coefficient such that the composite cavity has a mode wavelength expansion coefficient substantially equal to zero or the composite cavity has a mode wavelength expansion coefficient substantially equal to the peak gain wavelength coefficient.

14 Claims, 10 Drawing Figures

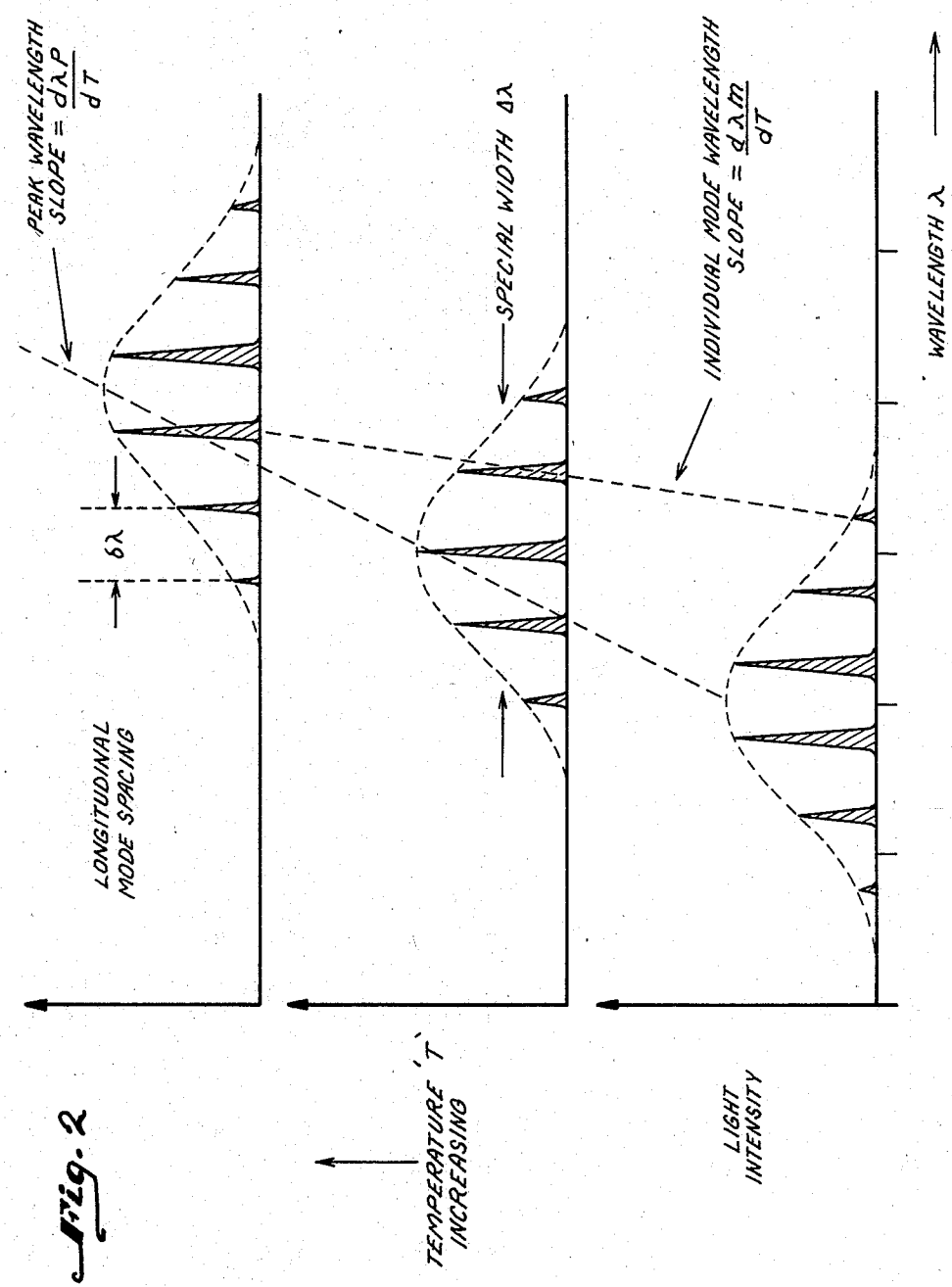

TEMPERATURE COMPENSATING SEMICONDUCTOR LASERS

BACKGROUND OF THE INVENTION

This invention relates to temperature effect compensation in semiconductor lasers provided with external cavities. The operation of semiconductor lasers with external cavities has been described by T. Kanada and K. Nawata in 'Optical Communictions', Vol.31 No. 1 pp 81-4 (October 1979) and by D. Renner and J. E. Carrol in 'Electronics Letters' Vol.15 No.3 pp 73-4 (February 1979).

SUMMARY OF THE INVENTION

According to a first aspect of the present invention there is provided a semiconductor laser in which at least a part of the laser optical feedback is provided by an external reflector spaced from the semiconductive material of the laser so as to form a composite optical cavity consisting of a semiconductive part provided by the semiconductive material and an external part of shorter optical path length provided by the space between the semiconductive material and the external reflecting surface, which external reflector is supported on a mount constructed such that in response to changes in temperature it moves the external reflector relative to the adjacent surface of the semiconductive material so as to provide the external part of the cavity with thermal expansion coefficient substantially matched with the mode wavelength expansion coefficient of the internal part of the cavity.

According to a second aspect of the present invention there is provided a semiconductor laser in which at least a part of the laser optical feedback is provided by an external reflector spaced from the semiconductive material of the laser so as to form a composite optical cavity consisting of a semiconductive part provided by the semiconductive material and an external part of shorter optical path length provided by the space between the semiconductive material and the external reflecting surface, which external reflector is supported on a mount constructed such that in response to changes in temperature it moves the external reflector relative to the adjacent surface of the semiconductive material so as to provide the external part of the cavity with thermal expansion coefficient substantially matched with the peak gain wavelength expansion coefficient.

According to a third aspect of the present invention there is provided a semiconductor laser in which the laser optical feedback is provided by an external reflector spaced from the semiconductive material of the laser so as to form a composite optical cavity consisting of a semiconductive part provided by the semiconductive material and an external part provided by the space between the semiconductive material and the external reflecting surface, which external reflector is supported on a mount constructed such that in response to changes in temperature it moves the external reflector relative to the anti-reflection coated adjacent surface of the semiconductive material so as to provide the external part of the cavity with thermal expansion coefficient providing the composite cavity with a mode wavelength expansion coefficient substantially equal to zero.

According to a fourth aspect of the present invention there is provided a semiconductor laser in which the laser optical feedback is provided by an external reflector spaced from the semiconductive material of the laser so as to form a composite optical cavity consisting of a semiconductive part provided by the semiconductive material and an external part provided by the space between the semiconductive material and the external reflecting surface, which external reflector is supported on a mount constructed such that in response to changes in temperature it moves the external reflector relative to the anti-reflection coated adjacent surface of the semiconductive material so as to provide the external part of the cavity with thermal expansion coefficient providing the composite cavity with a mode wavelength expansion coefficient substantially equal to the peak gain wavelength expansion coefficient.

BRIEF DESCRIPTION OF THE DRAWINGS

There follows a description of the background to the invention and illustrative embodiments of the invention. This description refers to the accompanying drawings in which:

FIG. 2 depicts graphs showing how the output of a semiconductor laser varies with temperature.

DESCRIPTION OF THE PREFERRED EMBODIMENTS

Figure 1A:
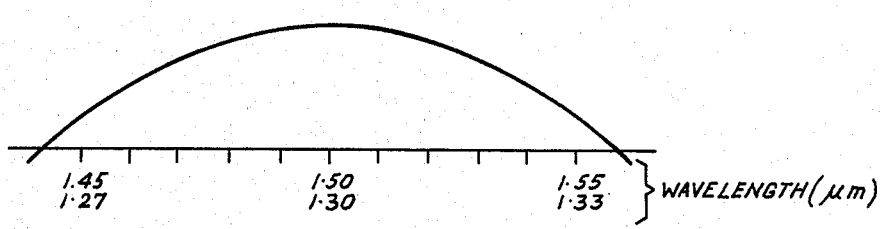
FIGS. 1a to 1d depicts graphs showing how the spectral output of a semiconductor laser are modified by the addition of an external reflector to form a short external cavity.

The longitudinal mode spectrum of semiconductor lasers is of great significance in long haul optical communication systems. The overall width of the spectrum or mode jumping between different modes of the laser cavity often determines the maximum data rate of the system because the chromatic dispersion of the fibre spreads the laser pulse in time. In an idealised semiconductor laser there is only a very weak selection of which longitudinal mode is operating. The laser Fabry Perot modes are separated by a wavelength $\delta\lambda$ determined by the cavity length, refractive index and centre wavelength. Typical values are given in table 1 for lasers of different wavelengths of 300 $\mu$m cavity length. For example a 1.3 $\mu$m emission wavelength laser 300 $\mu$m long has a longitudinal mode separation of about 0.6 nm. The gain spectrum which selects which mode operates is very broad, being between KT and 3 KT (KT=thermal energy=0.025 eV at room temperature) wide depending on current density. At 1.3 $\mu$m wavelength the gain spectrum is approximately parabolic, with a peak at 1.3 $\mu$m and dropping to zero gain at 1.27 and 1.33 $\mu$m as illustrated in FIG. 1a. If the gain spectrum is centred on a Fabry Perot mode at 1.3000 $\mu$m then the gain of the next mode at 1.3006 $\mu$m is only reduced by a fraction of $(0.6/30)^2 = 0.04\%$ compared to the centre mode. A mode that is an integral number 'n' of modes away from the centre mode has its gain reduced by a fraction $(0.6 \, n/30)^2 = 4 \times 10^{-4} n^2$ (this rule roughly applies to all semiconductor lasers 300 $\mu$m long whether at 0.85, 1.3 or 1.55 $\mu$m because both the width of the gain spectrum and the Fabry Perot mode spacing increase with the square of wavelength).

Because the gain spectrum selection is so weak the output spectrum of semiconductor lasers can readily be affected even by minute external reflections which can modulate the effective reflectivity of the end face of the laser as a function of wavelength. This is also the reason why the output spectrum of semiconductor lasers is one of their most variable parameters. Even with no external reflections the best semiconductor lasers operate in a single longitudinal mode only under d.c. operation. When modulation is applied (particularly when the drive level drops below threshold) the spectrum is usually broadened to several modes as illustrated in FIG. 1g.

The effect of an external mirror placed behind one of the reflecting facets of the laser that define the laser optical cavity so as to form an external cavity has the effect of altering the effective reflectivity, $R_{eff}$, of that facet. The minimum effective reflectivity occurs when the external cavity has a length of $N(\lambda/2)$, where N is an integral number, and consecutive minima are separated in wavelength by $\lambda^2/2L_c$ where $L_c$ is the length of the external cavity. Quite small reflectivities, even when associated with quite high losses in the external cavity, can have significant effects upon $R_{eff}$, and hence upon the operation of the laser. Thus it has been calculated that with a 4% reflectivity of the external cavity mirror (for instance provided by reflection at an air/silica interface), and with a 50% efficiency for the coupling of externally reflected power back into the laser cavity, the value of $R_{eff}$ will vary with external cavity length or wavelength from the value of about 30%, when no external cavity are present, in the range 22.5% to 37.5%. If the combined effects of the external cavity and the gain spectrum of the laser is to give two or more modes more or less identical round trip gains, then mode hopping is liable to occur.

Figure 1B:
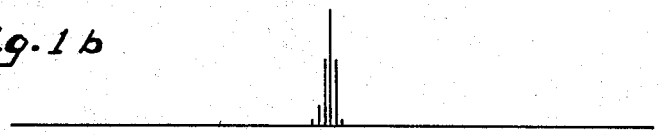
Figure 1C:
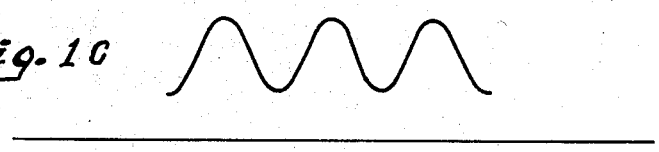
Figure 1D:
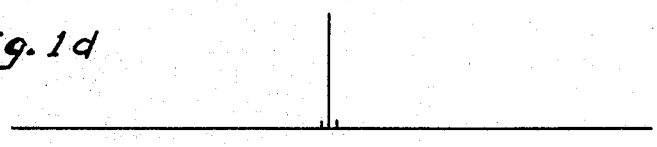

This effect is thus potentially a serious drawback to the operation of an optical fibre communications system, but with appropriate choice of spacing between the external reflector and the body of the semiconductor material of the laser, the effect can be turned to advantage by providing selectivity between longitudinal modes. This spacing is short compared with $L_s$, the optical path length of the semiconductive body, being typically in the range of one fifth to one twentyfifth of that length. (Optical path length is defined as the product of the physical length with the refractive index.) In the case of the 300 μm long (physical length) laser operating at 1.3 μm referred to previously with respect to FIGS. 1a and 1b, the addition of an external mirror to form an external cavity one twentieth of optical path length of the semiconductive body is to make the effective reflectivity $R_{eff}$ of the adjacent semiconductor facet a function of wavelength as depicted in FIG. 1c, which in turn has the effect of reducing the laser spectrum width, depicted in FIG. 1d, by a factor of about 5 as calculated for the previously considered example of a 4% reflector coupling power back into the semiconductor with 50% efficiency.

A further complication is that in a semiconductor laser without external cavity (i.e. a laser whose cavity is defined by the semiconductor facets) the wavelength of an individual mode μm is a function of temperature, and the peak gain wavelength λp is a different function of temperature. At $\lambda_p = 1.3$ μm $d\lambda_p/dT \simeq 0.5$ nm°C. and $d\lambda_m/dT \simeq 0.12$ nm°C. These effects are illustrated in FIG. 2.

The present invention is concerned with mounting the external reflector so that the spacing between it and the adjacent semiconductor facet is also a function of temperature, this function being chosen so that it will compensate one of four possible aspects of the composite temperature dependence. These four aspects may be divided into two parallel groups.

In the first group reflection at the semiconductor facet adjacent the external reflector is not entirely suppressed, and the external cavity expansion is chosen so that operation is centred either upon a particular mode or upon the peak gain wavelength. The option of centering on a particular mode has the drawback that the temperature of operation is limited to a specific range beyond which the wavelength of that mode is either too far removed from the peak gain wavelength for laser action to be sustained, or more normally is reduced below the gain of another mode that supplants it. The option of centering on the peak gain wavelength has the advantage of an extended range of temperature of operation, but the drawback that the operation will periodically jump from one longitudinal mode to an adjacent mode as the temperature is increased or decreased and that mode gets displaced further from the peak gain wavelength than its nearest rival.

In the second group reflection at the semiconductor facet adjacent the external reflector is suppressed so as to enable the value of $d\lambda_m/dT$ for the composite laser to be altered. In the laser without the external reflector the value of $d\lambda_m/dT$ is determined by the dilation in optical path length between the two reflecting semiconductor facets that is produced by the thermal expansion of the semiconductor and changes effective refractive index with temperature. In this second group the first option is to choose the expansion of external cavity to be of the opposite sign so as to balance the expansion in optical path length within the semiconductor so that $d\lambda_m/dT$ for the composite laser is zero. This gives single mode operation at constant wavelength and frequency, but, like the first option in the first group the temperature range of operation is restricted, and indeed is smaller than before. The second group second option is to choose the expansion coefficient to provide a value of $d\lambda_m/dT$ for the composite laser that will match $d\lambda_p/dT$. This means that the device will have the extended temperature range of the first group second option, but without any mode hopping.

Figure 3:
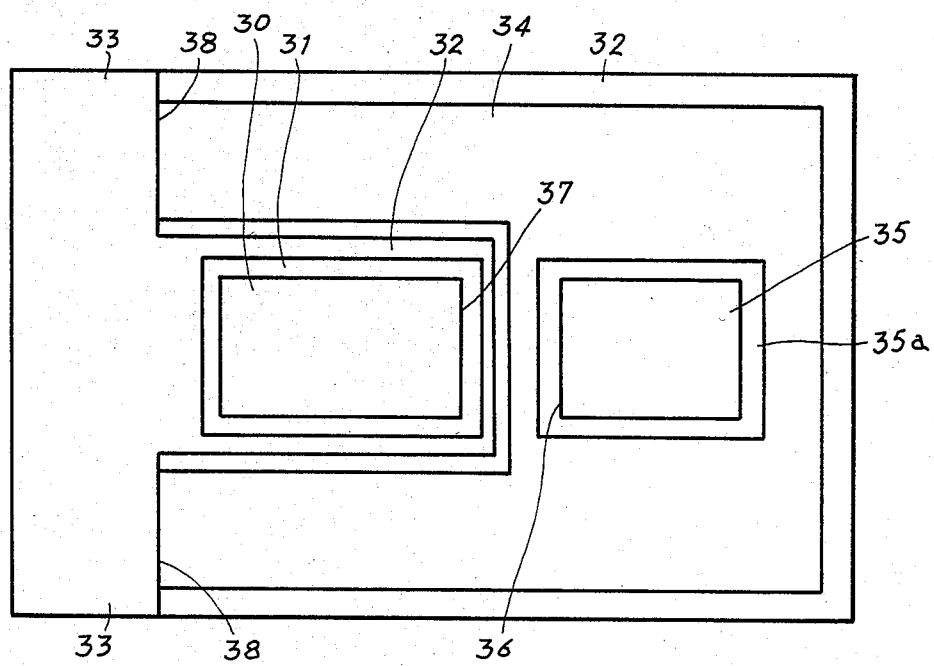
FIGS. 3 and 4 depict respectively a plan view and side elevation of a laser incorporating an external reflector mounted in accordance with the teachings of the present invention.
Figure 4:
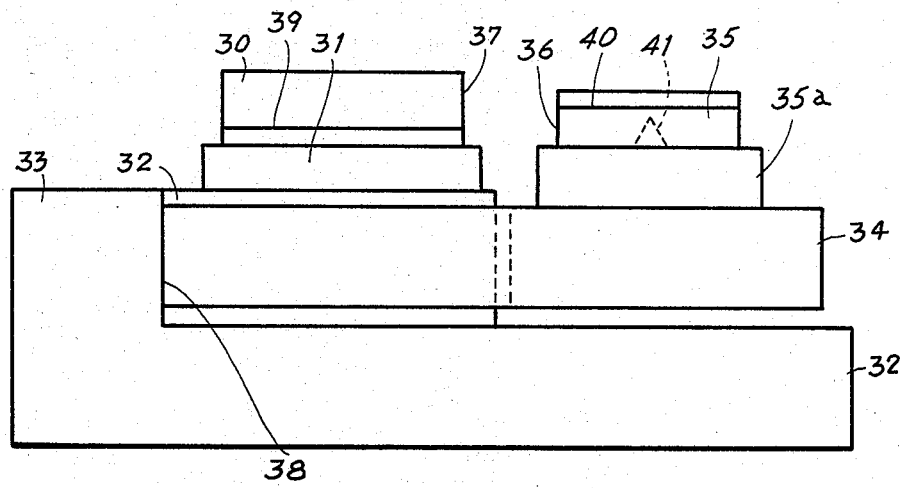

All four options are seen to involve mounting an extenal reflector in such a way that the space between it and the adjacent semiconductor facet has a particular value of expansion coefficient. A general manner in which this may be achieved is illustrated in the mount of FIGS. 3 and 4 which relies upon differential thermal expansion. In the mount of FIGS. 3 and 4 a semiconductor laser chip 30 is mounted on a submount 31. The submount should be made of material having an expansion coefficient matched with that of the laser chip so as to minimise any straining of the chip, and the material should also have a high thermal conductivity. The submount is in turn mounted on a substrate 32. The substrate 32 is provided with two lugs 33 to the sides of which is secured a generally U-shaped reflector support member 34 made of a material having a different thermal expansion coefficient from that of the substrate 32. A reflector 35 is mounted directly or indirectly on the base of the u of the support member so as to be aligned with the optical cavity of the laser chip. The resulting expansion coefficient of the space between the reflector face 36 and the adjacent facet 37 of the laser chip is thus essentially a function of the expansion coefficient of the substrate and that of the reflector support member and the distance from the joint between these materials to the facet 37 and the distance from the joint to the reflector.

Attention will now be directed in further detail to the previously mentioned first option of the first group, in which compensation is designed to track the wavelength variation with temperature of a particular longitudinal mode. For this the expansion coefficient of the distance $L_A$ between the reflector face 36 and the laser chip facet 37 must match the proportional rate of change of mode wavelength with temperature, i.e.

$$(dL_A/dT)(1/L_A) = (d\lambda_m/dT)(1/\lambda_m) \qquad \text{Equation 1}$$

In the case of a 300 μm long laser chip operating at 1.3 μm wavelength the optical path length of the semiconductor chip, $L_s$, is approximately 1.4 mm, and hence the distance $L_A$ is made about 70 μm to provide the external cavity with an optical path length approximately one twentieth of that of the laser chip. This reduces the spectral width of the gain reflectivity curve by a factor of about five compared with that of the laser in the absence of the reflector 35. This will have the effect of reducing the spectral width of the emission under all operating conditions by a similar amount, thereby ensuring virtually unconditional single longitudinal mode operation. Substitution in equation 1 shows that the expansion coefficient required for $L_A$ is approximately $9.2 \times 10^{-5}/°C$., which is approximately six times the expansion coefficient of copper. Therefore, if the substrate 32 is made of a zero thermal expansion coefficient alloy and the u-shaped support member 34 is made of copper, the front faces 38 of the lugs 33 need to be located a precise distance behind the reflecting face 36 which is approximately equal to six times 70 μm.

The limitation of this arrangement is that, although the optical cavity tracks the change of wavelength of a single mode, the peak gain wavelength changes at a faster rate with increasing temperature. This means that as the temperature rises the selected mode shifts through the peak in the gain characteristic from the long wavelength side to the short-wavelength side. Eventually the gain characteristic reaches the next lower order mode passed by the external cavity, and when its enhancing gain surpasses the diminishing gain of the original mode the laser operation will jump to the new mode. The external cavity is a twentieth of the optical path length of the laser chip whose mode separation is 0.6 nm, therefore the size of the jump is 12 nm. Relating this figure with the values of $d\lambda_p/dT$ and $d\lambda_m/dT$ from Table 1 it is seen that such mode jumps will occur at a temperature interval of approximately 31.4° C. Thus the temperature range is limited to the set temperature, plus or minus less than 15.7° C. The temperature interval is inversely proportional to $L_A$, so clearly this can be extended as a trade-off against selectivity.

If the foregoing limited temperature range is unacceptable for a particular application, it may be that the previously mentioned second option of the first group will be more acceptable. This may be so provided that the application is able to tolerate single mode jumps at the smaller spacing determined by the optical path length $L_s$ of the semiconductor chip. For a 1.3 μm wavelength laser having a physical length of 300 μm these mode jumps will be spaced by $\delta\lambda = 0.6$ nm. In this instance the expansion of the external cavity $L_A$ is arranged to track the peak gain wavelength instead of the mode wavelength and thus the relevant equation is:

$$(dL_A/dT)(1/L_A) = (d\lambda_p/dT)(1/\lambda_p) \qquad \text{Equation 2}$$

The required expansion coefficient is just over four times larger than in the case of the first option, and hence, assuming $L_s = 20 L_A$, entails the use of a reflector support member 34 with limbs just over four times as long. The line width will be basically very narrow with the exception that the laser mode will jump at the same temperature interval as an ordinary laser without external reflector. In this instance the interval is given by $\delta\lambda(d\lambda_p/dT - d\lambda_m/dT)^{-1} \simeq 1.6° C$.

In order to minimise the problems of mode jumps the semiconductor chip can be made longer, for instance 600 μm, which, for the interesting case of a 1.55 m wavelength laser, would give mode jumps of 0.5 nm every 0.8° C. The external cavity will normally ensure that mode jumping will be limited to a jump of a single mode at a time, and thereby restrict the worst case time jitter to 750 ps over 100 km of 15 ps/nm.km fibre, limiting the bit rate to about 300 Mbit/s. In view of the wide temperature range this is an attractive solution for submarine applications.

Although the reflector 35 may be specifically a mirror, one alternative, when using a photodetector to monitor the laser output, is to use the photodetector itself as a reflector. This is the particular arrangement shown in FIG. 4. Light emitted from the active layer 39 of the semiconductor chip 30 is arranged to strike substrate of the photodetector which is secured to a submount 35a. Some of the light is reflected at the facet 36, but some is transmitted into the body of the photodetector where it is not absorbed by the substrate material because this is chosen to have a higher band gap than that of the laser chip active layer. Some of the transmitted portion reaches lower band gap material of an epitaxially grown layer 40, where it is absorbed and used to provide the requisite photodetector output signal. The proportion of light reaching this layer 40 may be enhanced by etching a transverse groove 41 in the underside of the photodetector substrate.

Attention will now be transferred to the options of the second group. In this instance the facet 37 is provided with an antireflection coating so that the previously two distinct optical cavities having respectively optical path lengths $L_s$ and $L_A$ are merged into a single cavity. The expansion coefficient of $L_A$ is chosen in relation to that of $L_s$ to provide a particular value for the mode wavelength expansion coefficient for the composite cavity.

In the first option of the second group the expansion of $L_A$ is chosen to counter-balance the expansion of $L_s$ so as to make the mode wavelength expansion coefficient of the composite cavity equal to zero, and thereby produce an output that is of fixed wavelength width in a limited temperature range. This condition is represented by:

$$dL_A/dT = -dL_s/dT \qquad \text{Equation 3}$$

The expansion in $L_s$ is clearly directly related to the mode wavelength expansion so that $$dL_s/dT = (d\lambda_m/dT)(L_s/\lambda_m)$$

Therefore in the case of the 300 μm long laser chip operating at 1.3 μm the required absolute thermal expansion per °C. for $L_A$ is about 0.1 μm/°C. (It will be noted that the relevant parameter is the absolute thermal expansion per °C. rather than the thermal expansion coefficient.) This can be accommodated by the basic structure of FIGS. 3 and 4 by making the substrate 32 of high expansion coefficient material, and the reflector support member of low exapansion coefficient material. If these materials are respectively copper and a zero thermal expansion coefficient alloy, the front faces 38 of the lugs 33 need to be located a precise distance behind the antireflection coated facet 37 which is approximately equal to 6.2 mm.

Figure 5:
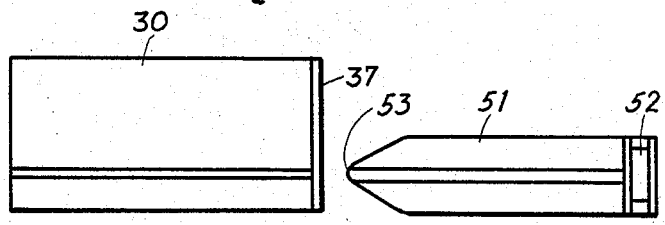
FIGS. 5 and 6 depict alternative special forms of spectrally selective external reflector incorporating respectively a multilayer dielectric coating or Fabry Perot etalon and a diffraction grating.

In the previously described options of the first group the reflector 35 and the facet 37 co-operate to form a short optical cavity providing the requisite spectral selectivity to ensure single mode operation, but in this instance the antireflection coating provided on the facet 37 prevents this selectivity from occurring, and hence selectivity needs to be achieved by alternative means. One way of achieving this selectivity is to use a grating as a spectally selective reflector. For this purpose the emission from facet 37 can be collimated and directed on a suitably oriented plane diffraction grating at 35 by means of an intervening antireflection coated lens (not shown). Another way of achieving selectivity is to direct the collimated beam on to a reflector at 35 which consists of a Fabry Perot etalon having an air spacing of about 70 μm. A further way is to launch the light from the facet 37 into a lensed single mode fibre (not shown in FIG. 3) which has a multilayer dielectric stack possibly compared with a Fabry Perot etalon. Such an arrangement is depicted schematically in FIG. 5 with the light emerging from facet 37 of the semiconductor chip 30 being launched into a fibre 51 terminating in an etalon 52 comprising two multilayer stacks separated by an appropriately determined annular spacer. The end 53 of the fibre is lens shaped in order to improve the launching efficiency of light into the fibre. This lens may be provided by the technique describned in the specification of our U.K. Patent Application No. 8136201 (identified by us as T. Bricheno 6). In order to suppress the formation of unwanted optical sub-cavities it is necessary to provide facet 37 with an antireflection coating, and for the same reason it is also desirable to provide the lensed end 52 with a similar antireflection coating.

Figure 6:
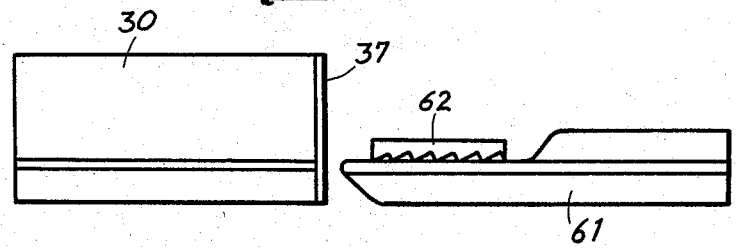

Alternatively as shown schematically in FIG. 6 the light launched into a lensed single mode fibre 61 which acts as a selective reflector by virtue of the effect of a diffraction grating 62 placed against or etched into the side of the fibre in a region where the optical cladding of the fibre has been removed so that the grating interacts with the evanescent field of the propagating mode in the fibre.

The single mode fibre approaches have the advantage that with them it is generally easier to keep the length $L_A$ down below a few millimeters in order not to impair significantly the direct modulation characteristics of the laser.

With this first option of the second group the wavelength is stable within a certain temperature range, but this is limited by the temperature dependence of this peak gain wavelength, which typically will limit the temperature range to about ±20° C., beyond which the lasing threshold increases unreasonably.

In the second option of the second group the temperature range restriction is removed, but the wavelength no longer remains constant. In this instance the expansion of $L_A$ is chosen in relation to that of $L_c$ to provide the composite cavity with a thermal expansion coefficient that is equal to the peak gain wavelength expansion coefficient $(d\lambda_p/dT)(1/\lambda p)$. Under these conditions when the temperature rises, the wavelength of the selected mode expands in step with the shift of the peak gain to longer wavelengths, with the result that mode jumps are eliminated. Referring to Table 1 it is seen that the peak gain wavelength expansion coefficients are relatively large compared with the thermal expansion coefficients of common metals, and thus the expansion coefficient of $L_A$ is required to be relatively large. The required relationship for this second option of the second group is $$(dL_C/dT)(1/L_C) = (d\lambda_p/dT)(1/\lambda) \quad \text{Equation 4}$$

where $L_C$ is the optical path length of the composite cavity and thus is equal to the sum of $L_A$ and $L_s$.

From equation 4 it is seen that $$(dL_C/dT) = dL_s/dT + dL_A/dT = (L_C/\lambda)(d\lambda_p/dT)$$

and, remembering that $$dL_s/dT = (L_s/\lambda)(d\lambda_m/dT)$$

it can readily be shown that the thermal expansion coefficient of the external cavity $L_A$ is given by $$(dL_A/dT)(1/L_A) = 1/\lambda \{d\lambda_p/dT \div (L_s/L_A)(d\lambda_p/dT - d\lambda_m/dT)\} \quad \text{Equation 5}$$

Inspection of equation 5 shows that, in the limit of $L_A$ very large compared with $L_s$, the thermal expansion coefficient of $L_A$ reduces towards $3.8 \times 10^{-4}$ per °C., which is approximately twenty four times that of copper. If $L_A = L_s$ this coefficient becomes $6.8 \times 10^{-4}$ per °C., which is approximately forty two times that of copper, whereas if $L_A = 5L_s$ it is $4.4 \times 10^{-4}$ per °C., which is approximately twenty eight times that of copper.

Figure 7:
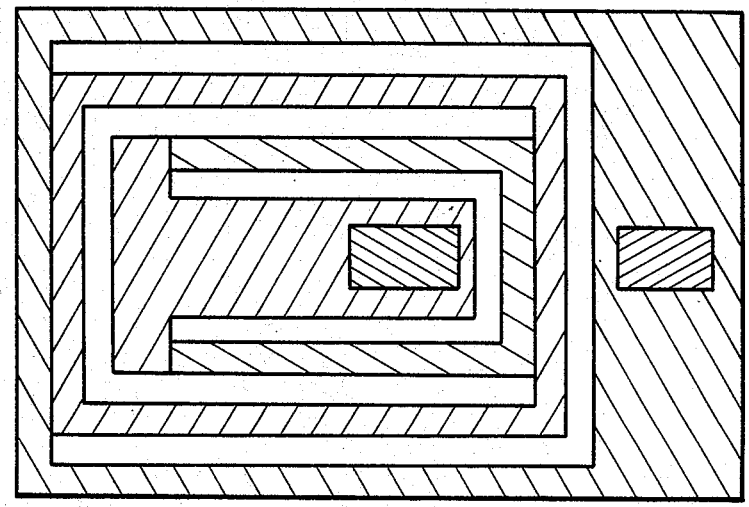

The magnitude of expansion coefficient for $L_A$ can be achieved by the mount construction depicted in FIGS. 3 and 4, but this produces a requirement for a high expansion coefficient U-shaped support member with somewhat inconveniently long limbs. This problem can be ameliorated by adopting a convoluted structure of alternate high and low expansion beams as for instance depicted schematically in FIG. 7. In this structure the semiconductor laser chip 30 is mounted on a low expansion substrate 70 to which is secured a U-shaped beam 71 of high expansion material. At the opposite end the beam 71 is connected to one end of a frame shaped beam arrangement 72 of low expansion material. At the opposite end of the frame 72 is connected a second frame 73. This frame 73 is of high expansion material and carries the external reflector 35.

The presence of the antireflection coating on facet 37 means that whatever the length $L_A$ there needs to be special provision of some form of spectral selectivity of reflection to ensure single longitudinal mode operation. This may be achieved by using a diffraction grating as the reflector 35, but in this instance it is to be noted that its peak reflectivity is required to be a function of temperature matching $d\lambda_p/dT$. This can be achieved by mounting using a differential expansion coefficient mount to rotate the diffraction grating with temperatures. An etalon can be used in place of the grating, but this also will need to have its reflectivity rendered a function of temperature matching $d\lambda_p/dT$. This means that instead of using a zero temperature coefficient spacer to define the gap between the two reflectors of the etalon, this spacer must have an expansion coefficient of $(d\lambda_p/dT)(1/\lambda_p)$. This can be provided by a differential expansion mount based on the same design principles employed to control $L_A$ in the mount of FIGS. 3 and 4.

The techniques described so far are entirely passive, that is the tuning between the external cavity and laser cavity is achieved by the initial alignment during assembly, relying on the expansion coefficient correction to maintain alignment as temperature varies. A further refinement of this technique is to use an electronic control circuit to 'fine tune' the external cavity or the laser frequency with respect to one another. This can be achieved by for instance use of a piezo electric voltage-displacement transducer controlled by an electronic feedback signal arranged to maximise the output from the front face of the laser. The thermal expansion coefficient of the correction described in the preceding paragraphs of this specification provides the coarse position setting with the electronic control providing the fine control. The electronic control only has to move the external mirror by very small distances and hence has a low voltage and/or power requirement compared with that that would be necessary if it were required to effect the whole compensation.

An alternative method of fine tuning is to tune the precise optical path length of the laser chip by controlling the drive current. In a conventional two terminal laser this imposes a limitation on the output level as the wavelength and output power cannot be independently controlled at fixed temperature. This restriction is removed in a 'three terminal' laser in which independent control of precise laser chip optical path length is provided by a dual cavity arrangement in which one cavity is passive and has its refractive index, and hence optical path length, controlled by an electro-optic effect, produced for instance by a reverse biased junction. Such a laser may be used in conjunction with the temperature compensated external cavity.

TABLE 1

| Material | (Al,Ga) As | (In,Ga) (As,P) | (In,Ga) (As,P) |
|---|---|---|---|
| $\lambda_p$ nm | 850 | 1300 | 1550 |
| $\delta\lambda$ nm (physical length = 300 μm) | 0.27 | 0.6 | 0.9 |
| $\Delta\lambda_{max}$ nm | 2.0 | 5.0 | 7.0 |
| $d\lambda_p/dT$ nm/°C. | 0.22 | 0.5 | 0.73 |
| $d\lambda_m/dT$ nm/°C. | 0.06 | 0.12 | 0.18 |

I claim:

1. A temperature compensating semiconductor laser comprising:
   a semiconductor laser chip;
   a substrate on which said chip is mounted;
   a support member mounted on said substrate, said support member having a different thermal expansion coefficient from that of said substrate;
   a reflector mounted on said support member and aligned with an internal optical cavity of said chip, said chip and said reflector forming a composite optical cavity comprising said internal optical cavity of said chip and an external cavity part of shorter optical path length comprising a space between the chip and an external surface of said reflector, said substrate and said support member having thermal expansion coefficients such that in response to temperature changes the reflector moves such that the thermal expansion coefficient of the space between said external surface of the reflector and the nearest external surface of said semiconductor chip is such that the said external cavity part has a thermal expansion coefficient substantially matched with the mode wavelength expansion coefficient of said internal optical cavity according to the equation $(dL_A/dT)(1/L_A)=(d\lambda_m/dT)(1/\lambda_m)$ where $L_A$ is the distance between said external surface of said reflector and said external surface of said semiconductor chip, $\lambda_m$=mode wavelength, and T=temperature.

2. A semiconductor laser as claimed in claim 1 wherein the optical path length of the external part of the composite optical cavity is between one fifth and one twentyfifth of the optical path length of the semiconductor part.

3. A semiconductor laser as claimed in claim 1 wherein the external reflector comprises an etalon providing spectral selectivity of reflection discriminated between longitudinal modes of adjacent mode number.

4. The semiconductor laser as claimed in claim 1, wherein the external surface of the reflector comprises a photodetector adapted to monitor the output power of the laser.

5. A temperature compensating semiconductor laser comprising:
   a semiconductor laser chip;
   a substrate on which said chip is mounted;
   a support member mounted on said substrate said support member having a different thermal expansion coefficient from that of said substrate;
   a reflector mounted on said support member and aligned with an internal optical cavity of said chip; said chip and said reflector forming a composite optical cavity comprising said internal optical cavity of said chip and an external cavity part of shorter optical path length comprising a space between the chip and an external surface of said reflector, said substrate and said support member having thermal expansion coefficients such that in response to temperature changes the reflector moves such that the thermal expansion coefficient of the space between said external surface of the reflector and the nearest external surface of said semiconductor chip is such that said external cavity part has a thermal expansion coefficient substantially matched with the peak gain wavelength expansion coefficient of said internal optical cavity according to the equation $(dL_A/dT)(1/L_A)=(d\lambda_p/dT)(1/\lambda_p)$ where $L_A$ is the distance between said external surface of said reflection and said external surface of said semiconductor chip, $\lambda_p$ is the peak wavelength, and T=Temperature.

6. The semiconductor laser as claimed in claim 5, wherein the optical path length of the external part of the composite optical cavity is between one fifth and one twentyfifth of the optical path length of the semiconductor part.

7. A temperature compensating semiconductor laser comprising:
   a semiconductor laser chip;
   a substrate on which said chip is mounted;
   a support member mounted on said substrate said support member having a different thermal expansion coefficient from that of said substrate;
   a reflector mounted on said support member and aligned with an internal optical cavity of said chip; said chip and said reflector forming a composite optical cavity comprising said internal optical cavity of said chip and an external cavity part of shorter optical path length comprising a space between the chip and an external surface of said reflector, said substrate and said support member having thermal expansion coefficients such that in response to temperature changes the reflector moves such that the thermal expansion coefficient of the space between said external surface of the reflector and the nearest external surface of said semiconductor chip is such that said composite optical cavity has a mode wavelength expansion coefficient substantially equal to zero as represented by the equation $dL_A/dT = -dL_S/dT$ where $L_A$ is the distance between said external surface of said reflector and said external surface of said semiconductor chip, $L_S$ is the optical path length of said semiconductor chip, and T is temperature.

8. A semiconductor laser as claimed in claim 7 wherein the external reflector consists of or incorporates a grating providing spectral selectivity of reflection discriminated between longitudinal modes of adjacent mode number.

9. A semiconductor as claimed in claim 7, wherein the external reflector incorporates a single mode fibre with a lens at the end nearer the semiconductive part of the optical cavity and spectral selectivity of reflection by the external reflector is provided by an etalon at the other end.

10. A semiconductor laser as claimed in claim 7, wherein the external reflecting surface is provided by the surface of a photodetector adapted to monitor the output power of the laser.

11. A semiconductor as claimed in claim 7 wherein the external reflector incorporates a single mode fibre with a lens at the end nearer the semiconductor part of the optical cavity and spectral selectivity of reflection by the external reflector is provided by a grating interacting with the evanescent filed of the fibre propagating mode.

12. A temperature compensating semiconductor laser comprising:
   a semiconductor laser chip;
   a substrate on which said chip is mounted;
   a support member mounted on said substrate said support member having a different thermal expansion coefficient from that of said substrate;
   a reflector mounted on said support member and aligned with an internal optical cavity of said chip; said chip and said reflector forming a composite optical cavity comprising said internal optical cavity of said chip and an external cavity part of shorter optical path length comprising a space between the chip and an external surface of said reflector, said substrate and said support member having thermal expansion coefficient such that in response to temperature changes the reflector moves such that the thermal expansion coefficient of the space between an external surface of the reflector and the nearest external surface of said semiconductor chip is such that provide said composite optical cavity with a mode wavelength expansion coefficient substantially equal to the peak gain wavelength expansion coefficient of said internal optical cavity according to the equation $(dL_C/dT)(1/L_C) = (d\lambda_p/dT)(1/\lambda_p)$ where $L_C$ is the optical path length of said composite optical cavity, $\lambda_p$ is peak wavelength, and T is temperature.

13. The semiconductor laser as claimed in claim 12, wherein the reflector comprises a grating providing spectral selectivity of reflection discriminated between longitudinal modes of adjacent mode number.

14. The semiconductor laser a claimed in claim 12, wherein the reflector comprises an etalon providing spectral selectivity of reflection discriminated between longitudinal modes of adjacent mode number.

* * * * *